United States Patent
Hong (10) Patent No.: US 9,105,592 B2
(45) Date of Patent: Aug. 11, 2015

(54) ORGANIC ELECTRONIC LIGHT EMITTING DEVICE AND METHOD OF FABRICATING THE SAME

(71) Applicant: EverDisplay Optronics (Shanghai) Limited, Shanghai (CN)

(72) Inventor: Fei Hong, Shanghai (CN)

(73) Assignee: EverDisplay Optronics (Shanghai) Limited, Shanghai (CN)

( * ) Notice: Subject to any disclaimer, the term of this patent is extended or adjusted under 35 U.S.C. 154(b) by 0 days.

(21) Appl. No.: 14/141,188

(22) Filed: Dec. 26, 2013

(65) Prior Publication Data

US 2014/0299852 A1 Oct. 9, 2014

(30) Foreign Application Priority Data

Apr. 8, 2013 (CN) .......................... 2013 1 0119757

(51) Int. Cl.
  H01L 29/08 (2006.01)
  H01L 27/32 (2006.01)
  H01L 51/52 (2006.01)
  H01L 51/05 (2006.01)

(52) U.S. Cl.
  CPC ........ H01L 27/3274 (2013.01); H01L 51/5296 (2013.01); *H01L 51/0554* (2013.01); *H01L 2251/308* (2013.01)

(58) Field of Classification Search
  CPC .......... H01L 29/04; H01L 51/00; H01L 51/51
  USPC ...................... 257/40, 88; 438/157
  See application file for complete search history.

(56) References Cited

U.S. PATENT DOCUMENTS

| | | | | |
|---|---|---|---|---|
| 6,229,259 | B1* | 5/2001 | Christensen, Sr. ............ | 313/498 |
| 6,734,505 | B2* | 5/2004 | Suzuki et al. ................. | 257/365 |
| 8,124,443 | B2* | 2/2012 | Marrocco et al. .............. | 438/99 |
| 2006/0208266 | A1* | 9/2006 | Yamamoto ...................... | 257/88 |
| 2011/0079784 | A1 | 4/2011 | Im | |

(Continued)

FOREIGN PATENT DOCUMENTS

| | | |
|---|---|---|
| CN | 102611558 A | 7/2012 |
| TW | 200308093 A | 12/2003 |

(Continued)

OTHER PUBLICATIONS

"First Office Action" issued by the Intellectual Property Office, Ministry of Economic Affairs, R.O.C. dated Mar. 18, 2015, Taiwan.

*Primary Examiner* — Mohammad Islam
*Assistant Examiner* — Chi-Hua Yang
(74) *Attorney, Agent, or Firm* — Yunling Ren; Eaton & Van Winkle (57) ABSTRACT

An organic electronic light emitting device includes a substrate; a first gate electrode formed on a top surface of the substrate; a first insulating layer formed on the top surface of the substrate and covering the first gate electrode; an organic layer formed on a top surface of the first insulating layer and comprising at least two organic layers with different conductivity type; a second insulating layer formed on a top surface of the organic layer; a second gate electrode formed on a top surface of the second insulating layer; and a source electrode and a drain electrode formed between the first and second insulating layers, and the source and drain electrodes located on both sides of the organic layer respectively.

15 Claims, 4 Drawing Sheets

(56) References Cited

U.S. PATENT DOCUMENTS

2012/0007064 A1* 1/2012 Noh et al. ............... 257/40
2012/0146713 A1* 6/2012 Kim et al. ............... 327/530

FOREIGN PATENT DOCUMENTS

TW 200424071 A 11/2004
TW 200922935 A 6/2009

* cited by examiner

ORGANIC ELECTRONIC LIGHT EMITTING DEVICE AND METHOD OF FABRICATING THE SAME

CROSS-REFERENCE TO RELATED APPLICATION

This application claims benefits of Chinese Patent Application No. 201310119757.8, filed on Apr. 8, 2013 in the State Intellectual Property Office of China, the disclosure of which is incorporated herein by reference in its entirety.

TECHNICAL FIELD

The present disclosure relates to an organic electronic light emitting device and method of manufacturing the same.

BACKGROUND

With the advent of the organic field-effect transistor and organic light emitting diode(OLED) with stack-layered structure in the 1980s, organic electronic devices have drawn a great attention and had a rapid development. Since organic semiconductor has many advantages, i.e., low manufacturing cost, flexibility and large-size, the application of organic optoelectronic-devices in the field of large-size flat panel display, flexible display and lighting should have a promising future. An organic light emitting diode (OLED) has been realized as an application element in the display. A display panel having better color saturation, larger viewing angle, higher contrast and lower power consumption compared with LCD can be obtained by use of OLED.

In the active-matrix organic light-emitting diode (AMOLED) display, the switch state of OLED is performed by the operation of thin film transistor (TFT) array. Therefore, during the manufacturing process of AMOLED, it is necessary to first establish TFT array on a glass substrate before manufacturing the OLED device. As the OLED device is built on top of the TFT array, which makes the manufacturing process of organic electronic light emitting device very complex. Moreover, the aperture ratio of display pixel is low as well as the pixel density as large space being occupied by the TFT array.

The above information disclosed in this Background section is only for enhancement of understanding of the background of the disclosure and therefore it may contain information that does not form the prior art that is already known in this country to a person of ordinary skill in the art.

SUMMARY

Additional aspects and advantages will be set forth in part in the description which follows and, in part, will be apparent from the description, or may be learned by practice of the disclosure.

The present disclosure provides an organic electronic light emitting device which integrates the multiple functions of emitting light and controlling switch state.

According to one aspect of the disclosure, an organic electronic light emitting device comprises a substrate; a first gate electrode formed on a top surface of the substrate; a first insulating layer formed on the top surface of the substrate and covering the first gate electrode; an compound organic layer formed on a top surface of the first insulating layer and comprising at least two organic layers with different conductive type; a second insulating layer formed on an top surface of the organic layer; a second gate electrode formed on a top surface of the second insulating layer; and a source electrode and a drain electrode formed between the first and second insulating layers, and the source and drain electrodes located on two opposite sides of the compound organic layer respectively. Wherein the compound organic layer comprises a first organic layer formed on the top surface of the first insulating layer; a third organic layer formed on a top surface of the first organic layer; and a second organic layer formed on a top surface of the third organic layer.

According to another aspect of the disclosure, a method for manufacturing the organic electronic light emitting device comprises the following steps:

Step 1: providing a substrate;

Step 2: forming a conductive layer on the substrate, and patterning the conductive layer to form a first gate electrode;

Step 3: forming an insulating layer on the first gate electrode;

Step 4: forming an organic compound layer on the first insulating layer;

Step 5: forming a source and drain electrodes on opposite sides of the organic compound layer;

Step 6: forming a second insulating layer on the source and drain electrodes;

Step 7: forming a second gate electrode on the second insulating layer.

BRIEF DESCRIPTION OF THE DRAWINGS

The foregoing and other features and advantages of the disclosure will be apparent to those skilled in the art in view of the following detailed description, taken in boundary with the accompanying drawings.

DETAILED DESCRIPTION

Exemplary embodiments of the disclosure will now be described more fully with reference to the accompanying drawings, in which exemplary embodiments are shown. Exemplary embodiments of the disclosure may, however, be embodied in many different forms and should not be construed as being limited to the embodiments set forth herein; rather, these embodiments are provided so that this disclosure will be thorough and complete, and will fully convey the concept of exemplary embodiments to those skilled in the art. In the drawings, the thicknesses of layers and regions are exaggerated for clarity. Like reference numerals in the drawings denote like elements, and thus their description will be omitted.

The described features, structures, or/and characteristics of the disclosure may be combined in any suitable manner in one or more embodiments. In the following description, numerous specific details are disclosed to provide a thorough understanding of embodiments of the disclosure. One skilled in the relevant art will recognize, however, that the disclosure may be practiced without one or more of the specific details, or with other methods, components, materials, and so forth. In other instances, well-known structures, materials, or operations are not shown or described in detail to avoid obscuring aspects of the disclosure.

According to the present disclosure, one surface of a substrate 100 where a first gate electrode is located is defined as a top surface, and the opposite surface thereof is defined as a bottom surface; and the upper and bottom surface of other element is in accordance with that of the substrate 100.

The First Embodiment

Figure 1:
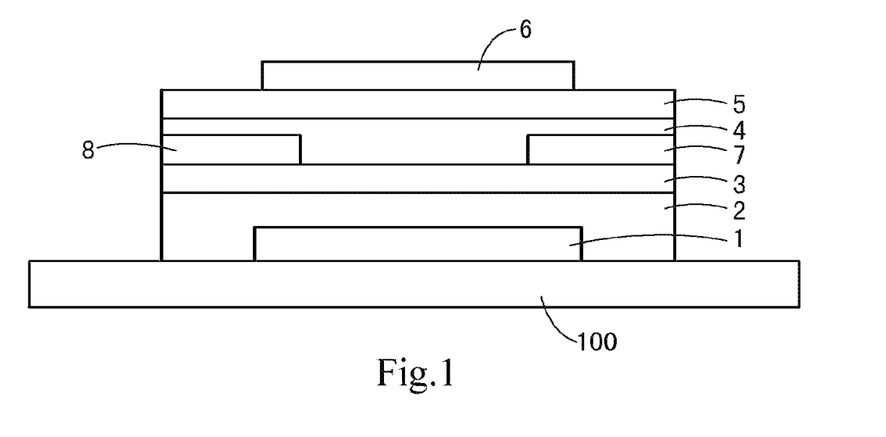
FIG. 1 illustrates a schematic view of an organic electronic light emitting device according to the first embodiment of the disclosure.

Referring to FIG. 1, the organic electronic light emitting device according to the first embodiment of the present disclosure includes a substrate 100, 4 electrodes, two insulating layers and two organic layers. In detail, the organic electronic light emitting device according to the first embodiment includes: a substrate 100, a first gate electrode 1 formed on the top surface of the substrate 100, a first insulating layer 2 formed on the top surface of the substrate 100 and covering the first gate electrode 1, a first organic layer 3 formed on the top surface of the first insulating layer 2, a source electrode 7 and a drain electrode 8 formed on opposite sides of the top surface of the first organic layer 3 respectively, a second organic layer 4 formed on the source electrode 7 and drain electrode 8 and covering the rest top surface of the first organic layer 3, a second insulating layer 5 formed on the top surface of the second organic layer 4, and a second gate electrode 6 formed on the top surface of the second insulating layer 5. The first organic layer 3 and the second organic layer 4 are collectively named organic compound layer.

The substrate 100 may be a transparent substrate, or a flexible substrate.

The conductivity type of the first and second organic layers 3, 4 are different. For example, the first organic layer 3 is of N-type, while the second organic layer is of P-type, and vice versa. The first and second gate electrodes 1, 6 may control the switch state of the device. The source electrode 7 and drain electrode 8 apply transporting voltage for carriers.

The first and second gate electrodes 1, 6 may be ITO layer, metal layer formed of one selected from a group consisting of Mo, Cr, Au, Mg, Ca, Ag, Al, Cu or W, or alloy layer formed of two or more selected from the above group, or stacked layers structure formed by at least two metal layers, or stacked layers structure formed by at least two alloy layers, or stacked layers structure formed by at least one metal layer and at least one alloy layer. The structure and material of the first and second gate electrodes 1, 6 may be or may not be the same.

The first and second insulating layers 2, 5 may be inorganic insulating layer formed of one or more selected from a group consisting of inorganic $SiO_2$, SiNx, or $Al_2O_3$, or organic insulating layer formed of one or more selected from a group consisting of organic Polyvinyl Alcohol (PVA), Poly methyl methacrylate (PMMA), Polystyrene (PS) or Polyvinylpyrrolidone (PVP), or stacked layers structure formed by at least two inorganic insulating layers, or stacked layers structure formed by at least two organic insulating layers, or stacked layers structure formed by at least one inorganic insulating layer and at least one organic insulating layer. The structure and material of the first and second insulating layers 2, 5 may be the same or not the same. The first and second insulating layers 2, 5 are gate insulation layers for the first and second gate electrodes 1, 6 respectively. The carrier concentration in the first and second organic layers 3, 4 can be regulated by the gate voltage and gate capacitance (which plays the similar function to the gate capacitance of TFT). The gate electrode 2 with stacked layers structure has the following two advantages: first, the structure with two or more layers has better insulation effect; second, the upper insulation layer as the modifying layer for the lower insulation layer can help to deposit the organic layer on the upper insulation layer more orderly, thus improving densification properties and mobility for the organic film. The second insulating layer 5 with double insulation layers has an advantage of that the lower insulation layer as the buffer layer can reduce the damage to the organic film during the manufacturing process of the upper insulating layer.

The first and second organic layers 3, 4 may be an organic small molecule layer formed of organic small molecule material or doped organic small molecule material, or an organic polymer layer formed of organic polymer material or doped organic polymer material, or a stacked layers structure formed by at least two organic small molecule layers, or a stacked layers structure formed by at least two organic polymer layers, or a stacked layers structure formed by at least one organic small molecule and at least one organic polymer layer. The first and second organic layers 3, 4 may be the same or not the same. The first and second organic layers 3, 4 are used as an electron injection/ transport layer, and a hole injection/ transport layer respectively. The electron and hole come into recombination at the boundary between the first and second organic layers 3, 4 to generate light.

The source electrode 7 and drain electrode 8 may be a metal layer formed of one selected from a group consisting of Au, Mg, Ca, Ag, Al or Cu, or an alloy layer formed of two or more selected from the above group, or a stacked layers structure formed by at least two metal layers, or a stacked layers structure formed by at least two alloy layers, or a stacked layers structure formed by at least one metal layer and at least one alloy layer. The stacked layers structure formed by at least two metal layers comprises at least one metal having a low work function, such as having a work function less than 4.3 eV, and at least one metal having a high work function, such as having a work function higher than 4.3 eV. Moreover, the high work function metal contacts with P-type organic semiconductor, and the low work function metal contacts with N-type organic semiconductor.

The function of the source electrode 7 and drain electrode 8 is injecting electron and hole, and applying voltage to meet the demand of the electron and hole transporting and light emitting (which play the similar function with the anode and a cathode of OLED). The function of the first and second gate electrodes 1, 6 is accumulating charge, controlling charge concentration, and pulling the electron and hole to the boundary between the first and second organic layers 3, 4. When the first organic layer 3 is P-type organic semiconductor, and the second organic layer 4 is N-type organic semiconductor, then the drain electrode 8 is formed by low work function material having a work function less than 4.4 eV so as to facilitate the electron injection, and the source electrode 7 is formed by high work function material having a work function higher than 4.4 eV so as to facilitate the hole injection.

In the present embodiment, the structure and material of the source and drain electrode may be or may not be the same, for example, both of them are made of alloy of Mg/Ag.

In the first embodiment, the source and drain electrodes 7, 8 formed on opposite of the top surface of the first organic layer 3 simultaneously, therefore, the source and drain electrodes 7, 8 can be made in the same process, which can simplify the manufacturing process. The second insulation layer 5 and the second gate electrode 6 not only play a rule as a function layer for light emitting device, but also play an encapsulation role for the first and second organic layers 3, 4.

Figure 2:
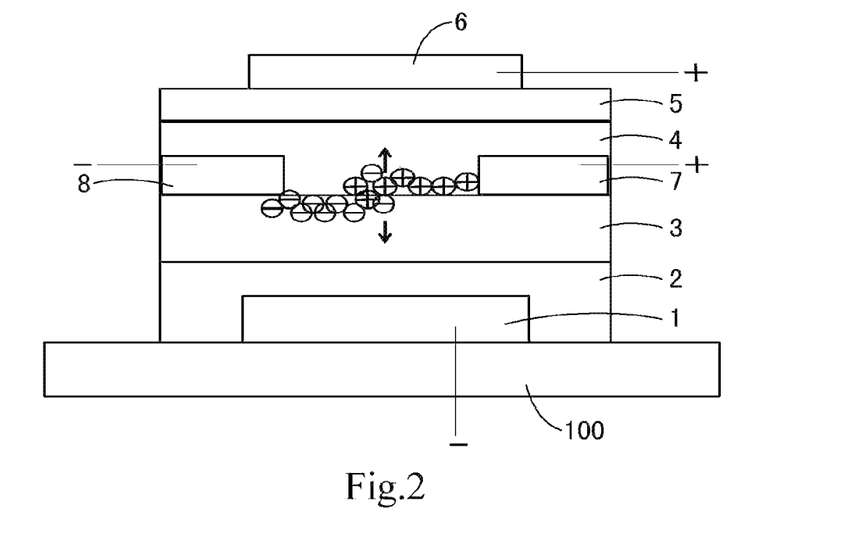
FIG. 2 illustrates a schematic view of the operating principle for the organic electronic light emitting device according to the first embodiment of the disclosure.

Referring to FIG. 2, the following explanation illustrates the operating principle for the present disclosure by taking the first embodiment of the organic electronic light emitting device for example.

Defining first organic layer 3 as N-type organic semiconductor, and the second organic layer 4 as P-type organic semiconductor, then the first gate electrode 1 is applied a negative bias, the second gate electrode 6 is applied a positive bias, the source electrode 7 is applied a positive bias, the drain electrode 8 is applied a negative bias. The following operating principle is similar to the organic thin film transistor (OTFT) in the state that the first gate electrode 1 is applied a negative bias. Under the influence of an electrical field of the first gate electrode 1 and source electrode 7, the holes are injected into the second organic layer 4 from the source electrode 7, and are drawn down to the boundary between the first and second organic layers 3, 4 under the influence of an electrical field of the first gate electrode 1 applied a negative bias. Meanwhile, the electrons are injected into the first organic layer 3 due to the second gate electrode 6 applied a positive bias; and the electrons are drawn up to the boundary between the first and second organic layers 3, 4 under the influence of an electrical field of the second gate electrode 6. The following operating principle is similar to the field-effect transistor (FET). When the bias values applied between the first and second gate electrodes 1, 6 is larger than the threshold voltage (Vt), and the charges are accumulated to a certain degree, the conducting channels of the first and second organic layers 3, 4 will be turned on. There is lateral electric field between the source and drain electrodes 7, 8 at this case, therefore, the holes in the second organic layer 4 flow from the source electrode 7 to the drain electrode 8, and the electrons in the first organic layer 3 flow from the drain electrode 8 to the source electrode 7. Under the powerful draw up/draw-down function of the two gate electrodes, the electrons and holes come into recombination at the boundary to generate light. Both of the first and second organic layers 3 and 4 may play a role of charge transport layer and light-emitting layer.

In the first embodiment of the organic electronic light emitting device, in case that the first gate electrode 1 is a transparent electrode, then the organic electronic light emitting device is a bottom emitting device; in case that the second gate electrode 6 is a transparent electrode, then the organic electronic light emitting device is a top emitting device; in case that both of the first and second gate electrodes 1, 6 are transparent electrodes, then the organic electronic light emitting device is bi-directional emitting device.

The Second Embodiment

Figure 3:
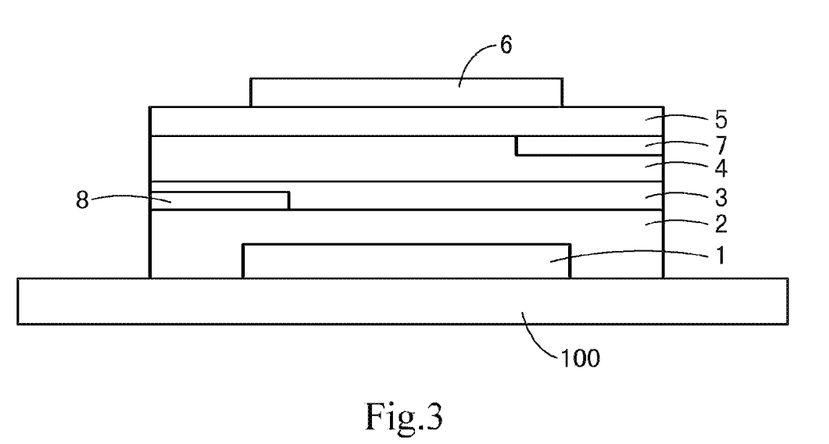
FIG. 3 illustrates a schematic view of an organic electronic light emitting device according to the second embodiment of the disclosure.

Referring to FIG. 3, the organic electronic light emitting device in the second embodiment is generally the same as the first embodiment except for the following differences. In the organic electronic light emitting device of the second embodiment, the source electrode 7 is formed on the right side of the second organic layer 4 and under the second insulation layer 5, and the drain electrode 8 is formed on the left side of the first organic layer 3. The arrangement of the source and drain electrodes 7, 8 has the following advantages: in this structure, both electrodes and holes are injected from top electrode, which can optimize the injection efficiency. In addition, in this structure, electrodes and holes may only be transported between two electrodes, which is similar with the vertical structure in OLED, thus the transporting path thereof is steady, and the charge recombination and luminous efficiency are improved.

Other parts of the organic electronic light emitting device of the second embodiment are the same as that of the first embodiment mentioned above and the detailed description is omitted herein.

The Third Embodiment

Figure 4:
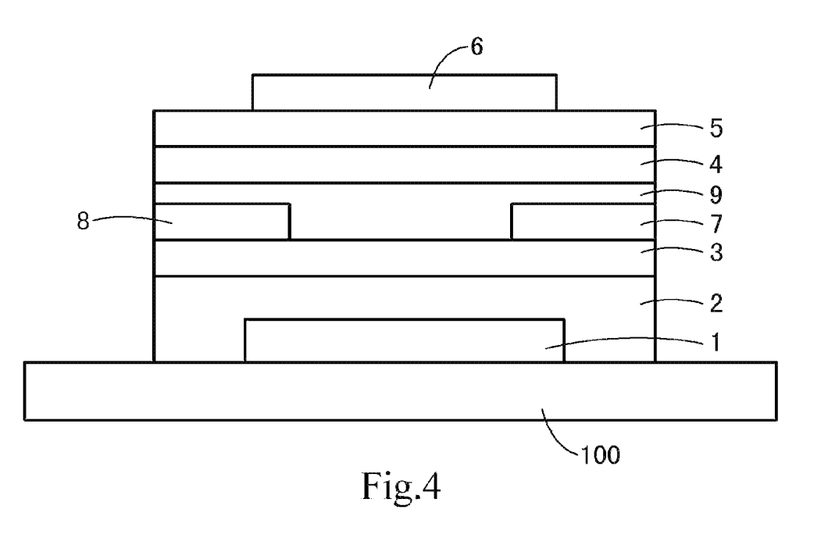
FIG. 4 illustrates a schematic view of an organic electronic light emitting device according to the third embodiment of the disclosure.

Referring to FIG. 4, the organic electronic light emitting device in the third embodiment is generally the same as the first embodiment except for the following differences. The organic electronic light emitting device in the third embodiment further comprises a third organic layer 9. The third organic layer 9 is one selected from a group consisting of N-type organic semiconductor, P-type organic semiconductor, bipolar organic semiconductor, or doped organic semiconductor including host and dopant, such as Alq3, TAZ, TPD, Bepp2, Bebp2, Zn(ODZ)2, Al(ODZ)3, Zn(BIZ)2, NPB, PyPySPyPy, BCzVBi, perylene and derivatives thereof. The third organic layer 9 is formed between the first and second organic layers 3, 4. The source and drain electrodes 7, 8 are located on opposite sides of the third organic layer 9.

In the third embodiment of the organic electronic light emitting device, the first and second organic layers 3, 4 may only help the charge transport, and the electrons and holes recombine to generate light at the third organic layer 9.

In the present disclosure, the positions of the source and drain electrodes 7, 8 are not limited to the first, second and third embodiment mentioned above. Any position at opposite sides of the organic layers, and between the first and second insulation layers 2, 5 is feasible for the source and drain electrodes 7, 8. For example, the source electrode 7 may be located at the bottom surface of the second organic layer 4, the top surface of the third organic layer 9, the bottom surface of the third organic layer 9, or the bottom surface of the second insulation layer 5. The drain electrode 8 may be located at bottom surface of the second organic layer 4, the top surface of the third organic layer 9, the bottom surface of the third organic layer 9, or the bottom surface of the second insulation layer 5.

Other parts of the organic electronic light emitting device of the third embodiment are the same as that of the first embodiment mentioned above and the detailed description is omitted herein.

Method for Manufacturing the Organic Electronic Light Emitting Device

A method for manufacturing the organic electronic light emitting device according to the present disclosure includes the following steps.

Step 1: Providing a glass substrate 100, and cleaning it.

Step 2: Sputtering a conductive layer with the thickness of 2000A, e.g. ITO layer, on the glass substrate 100 by magnetron sputtering process, and patterning first gate electrode 1 by photolithography process. Wherein, the conductive layer may also be formed by vapor deposition process or evaporation process.

Step 3: Forming SiNx layer with the thickness of 150 A as a first insulating layer 2 on the first gate electrode 1 by PECVD process, and patterning it in photolithography process. The first insulating layer 2 may be formed in PECVD process in case that it is inorganic; and the first insulating layer 2 may be formed by a spin-on process in case that it is organic polymer.

Step 4: Depositing Alq3 with the thickness of 300A as a first organic layer 3 on the first insulating layer 2 by use of shadow mask. The first organic layer 3 may also be formed by a spin-on process, printing process or image transfer process.

Step 5: Depositing stacked layers structure including Al with the thickness of 200A and Au with the thickness of 200A as a source and drain electrodes 7, 8 on the first organic layer 3 by use of shadow mask. The length of the channel is but not limited to 50 μm, which is feasible in the range of 5 μm~200 μm. In addition to the above stacked layers structure including Al and Au, other metal, alloy or material can replace Al and Au to form a stacked layers structure. Moreover, the stacked layers structure is not limited to the above two layers, it also may be have three or more layers with two type of metal or alloy. Furthermore, it is feasible to deposit only one type of metal or alloy to form the source and drain electrodes 7, 8 with single material by use of shadow mask. The first organic layer 3 may also be formed by printing process or image transfer process.

Step 6: Depositing CuPc with the thickness of 500A as a second organic layer 4 at channels located on the source and drain electrodes 7, 8 and the portion therebetween. The second organic layer 4 may also be formed by a spin-on process, printing process or image transfer process.

Step 7: Coating PVA with the thickness of 150A as a buffer layer on the second organic layer 4, and then coating PS with the thickness of 5000A as a second insulation layer 5 on the buffer layer. The buffer layer can be formed with other organic polymer material. In case that the second insulation layer 5 is formed with inorganic, such as $SiO_2$, $SiNx$, $Al_2O_3$, etc, it can be manufactured by PECVD process. In case that the second insulation layer 5 is formed with organic polymer, such as PVA, PMMA, PS, PVP, etc, it can be manufactured by spin-on process.

Step 8: Depositing Al with the thickness of 2000A as a second gate electrode 6 on the second insulation layer 5 by use of shadow mask.

In the organic electronic light emitting device manufactured according to the present embodiment, the drain electrode 8 is grounded or applied a negative bias; the source electrode 7 is applied a positive bias of +20V. The light emitting device can be turned on in the case that the first gate electrode 1 is applied a negative bias lower than −10V, and the second gate electrode 6 is applied a positive bias higher than +15V. That is, Vt1 value is −10V, Vt2 value is −15V. The light emitting device can be turned on in the sate that both of the value of Vt1 and Vt2 higher than threshold voltage. The higher the Vt, the higher the carrier concentration, and the brighter the organic light emitting device. Moreover, as the voltage of the source electrode 7 is increased, the channel current is increased, and the brightness of the organic light emitting device will be increased. The organic light emitting device will turned off in the case that both of the value of Vt1 and Vt2 lower than threshold voltage.

Based on the above technical solution, the present disclosure has one or more advantages and benefit effects as follows. The present disclosure comprises at least two organic layers, two gate electrodes, source electrode and a drain electrode. The holes and electrons can be injected continuingly into the two organic layers by the source and drain electrodes respectively. Under the influence of an electric field of the gate electrodes, the electrons and holes come into recombination at the boundary between the two organic layers or at the middle organic layer to generate light. The whole light emitting device will be turned off when voltage bias is not applied to at least one gate electrode without any additional element for controlling the switch state. Therefore, the organic electronic light emitting device according to the present disclosure integrates the multiple functions of emitting light and controlling switch state, which has a compact structure. Moreover, the present disclosure can substantially improve the aperture ratio of the display pixel, simplify the manufacturing operation, and reduce production costs.

The structure of the present organic light emitting device may be viewed as a light emitting device formed by overlapping a P-type TFT and a N-type TFT. Taking the first embodiment for example, referring to FIG. 1, a structure similar to the N-type TFT is configured by the second organic layer 4, the first insulating layer 2, the first gate electrode 1 of N-type organic semiconductor, and the source and drain electrodes 7, 8; and a structure similar to the P-type TFT is configured by the first organic layer 3, the second insulating layer 5, the second gate electrode 6 of P-type organic semiconductor, and the source and drain electrodes 7, 8. The above P-type TFT and N-type TFT are overlapped with the source and drain electrodes 7, 8 as a common electrodes thereof to configure the present organic light emitting device. Therefore, the organic light emitting device of the present disclosure may also be called Double Gate Organic Light Emitting Transistor (DGOLET) or four-electrode light emitting device.

The organic light emitting device of the present disclosure plays a function that is equivalent to a device integrating the conventional TFT and OLED, thus, the present disclosure can realize light emitting and ON/OFF controlling independently. The present disclosure can be applied to the field of flat panel display, flexible display, transparent display and lighting. The present disclosure maximizes multi-function integration, so that the pixels can be arranged under high intensity, thus improving luminous efficiency and promoting image PPI, and the present disclosure are suitable for manufacturing product with thinner size. Meanwhile, compared with the conventional process for AMOLED panel, which should establish TFT array on a glass substrate before manufacturing OLED light emitting device, the present disclosure can reduce the procedures, thus simplifying the operation considerably, improving product yield, and reducing production costs.

It should be noted that the above embodiments are only illustrated for describing the technical solution of the disclosure and not restrictive, and although the embodiments are described in detail by referring to the aforesaid embodiments, the skilled in the art should understand that the aforesaid embodiments can be modified and portions of the technical features therein may be equally changed, which does not depart from the spirit and scope of the technical solution of the embodiments of the disclosure.

What is claimed is:

1. An organic electronic light emitting device, comprising:
a substrate;
a first gate electrode formed on a top surface of the substrate;
a first insulating layer formed on a top surface of the substrate and covering the first gate electrode;
a compound organic layer formed on a top surface of the first insulating layer and having at least two organic layers with different conductivity types;
a second insulating layer formed on a top surface of the compound organic layer;
a second gate electrode formed on a top surface of the second insulating layer; and
a source electrode and a drain electrode formed between the first and second insulating layers, and the source and drain electrodes located on two opposite sides of the compound organic layer respectively;
wherein the compound organic layer comprises:

a first organic layer formed on the top surface of the first insulating layer;

a third organic layer formed on a top surface of the first organic layer; and a second organic layer formed on a top surface of the third organic layer.

2. The organic electronic light emitting device of claim 1 further comprising:

a buffer layer formed between the second organic layer and second insulating layer.

3. The organic electronic light emitting device of claim 1, wherein the first gate electrode and second gate electrode each is formed by a material selected from the group consisting of ITO, Mo, Cr, Au, Mg, Ca, Ag, Al, Cu, W and the combination thereof.

4. The organic electronic light emitting device of claim 1, wherein the first insulating layer and second insulating layer each comprises at least one inorganic insulating layer which is formed by a material selected from the group consisting of $SiO_2$, SiNx and $Al_2O_3$, or at least one organic insulating layer formed by a material selected from the group consisting of organic PVA, PMMA, PS and PVP.

5. The organic electronic light emitting device of claim 1, wherein the first organic layer and second organic layer are organic small molecule layers formed of organic small molecule material or doped organic small molecule material, or organic polymer layers formed of organic polymer material or doped organic small molecule material, or formed by at least two organic small molecule layers, or formed by at least two organic polymer layers, or formed by at least one organic small molecule and at least one organic polymer layer.

6. The organic electronic light emitting device of claim 1, wherein the source and drain electrodes each comprises at least one metal layer formed by a material selected from the group consisting of Au, Mg, Ca, Ag, Al, Cu, and the combination thereof 7. The organic electronic light emitting device of claim 6, wherein the source electrode and drain electrode each comprises at least two metal layers, in which, at least one of the two metal layers has a work function less than 4.3 eV, and the other metal layer has a work function higher than 4.3 eV.

8. The organic electronic light emitting device of claim 6, wherein both the source electrode and drain electrode are made of alloy of Mg/Ag.

9. The organic electronic light emitting device of claim 1, wherein the source electrode is located at least on one of the top surface of the first insulation layer, the top surface of the first organic layer, a bottom surface of the second organic layer, the top surface of the third organic layer, a bottom surface of the third organic layer, and a bottom surface of the second insulation layer.

10. The organic electronic light emitting device of claim 1, wherein the drain electrode is located at least on one of the top surface of the first insulation layer, the top surface of the first organic layer, a bottom surface of the second organic layer, the top surface of the third organic layer, a bottom surface of the third organic layer, and a bottom surface of the second insulation layer.

11. The organic electronic light emitting device of claim 1, wherein the substrate is a flexible substrate.

12. The organic electronic light emitting device of claim 1, wherein the substrate is a transparent substrate.

13. The organic electronic light emitting device of claim 1, wherein the first organic layer is one selected from an N-type organic semiconductor or a P-type organic semiconductor, and the second organic layer is another one selected from an N-type organic semiconductor and a P-type organic semiconductor.

14. The organic electronic light emitting device of claim 13, wherein the first organic layer is N-type organic semiconductor, and the second organic layer is P-type organic semiconductor, the source electrode used for injecting hole into the second organic layer is used to supply a positive bias, the drain electrode used for injecting electron into the first organic layer is used to supply a negative bias, the first gate electrode is used to supply a negative bias, the second gate electrode is used to supply a positive bias.

15. The organic electronic light emitting device of claim 1, wherein the third organic layer is one selected from the group consisting of N-type organic semiconductor, P-type organic semiconductor, bipolar organic semiconductor, and doped organic semiconductor including host and dopant.

\* \* \* \* \*